United States Patent [19]

Raaijmakers

[11] Patent Number: 5,755,936
[45] Date of Patent: May 26, 1998

[54] TEMPERATURE CLAMPED ANTI-CONTAMINATION AND COLLIMATING DEVICES FOR THIN FILM PROCESSES

[75] Inventor: Ivo J. Raaijmakers, San Jose, Calif.

[73] Assignee: Applied Materials, Inc., Santa Clara, Calif.

[21] Appl. No.: 370,047

[22] Filed: Jan. 9, 1995

Related U.S. Application Data

[62] Division of Ser. No. 198,920, Feb. 18, 1994, Pat. No. 5,419,029.

[51] Int. Cl.⁶ ............................................... C23C 14/34
[52] U.S. Cl. ........................... 204/298.11; 204/192.12; 204/298.09
[58] Field of Search ............... 204/192.12, 298.02, 204/298.11, 298.09

[56] References Cited

U.S. PATENT DOCUMENTS

| | | | |
|---|---|---|---|
| 4,001,928 | 1/1977 | Schweiso | 29/447 |
| 4,126,758 | 11/1978 | Krumme | 174/52 FP |
| 4,416,759 | 11/1983 | Harra et al. | 204/298.11 |
| 4,933,066 | 6/1990 | Katsura et al. | 204/298.11 |
| 5,112,467 | 5/1992 | Zejda | 204/298.11 |
| 5,240,580 | 8/1993 | Henderson et al. | 204/298.11 |
| 5,254,236 | 10/1993 | Kinokiri et al. | 204/298.11 |

FOREIGN PATENT DOCUMENTS 4013-868-A  5/1990  Japan.

*Primary Examiner*—Nam Nguyen
*Attorney, Agent, or Firm*—Birgit E. Morris; Donald Verplancken

[57] ABSTRACT

In a thin film process system, an anti-contamination device, anti-flake shield or collimator plate, is fit to a process chamber. By maintaining a temperature differential between the chamber body and the device, or between the device and any adapter used to conform the device to the chamber apparatus, the device expands to maintain a substantially sealing press fit to the chamber body. The temperature differential can be maintained even when the process is finished until it is time to remove the device for cleaning or disposal and replacement.

7 Claims, 5 Drawing Sheets

TEMPERATURE CLAMPED ANTI-CONTAMINATION AND COLLIMATING DEVICES FOR THIN FILM PROCESSES

This is division of application Ser. No. 08/198,920 filed Feb. 18, 1994, now U.S. Pat. No. 5,419,029.

BACKGROUND OF THE INVENTION

1. Field of the Invention

The present invention relates generally to thin film technology and, more particularly, to anti-contamination shields and collimators for thin film process apparatus.

2. Description of the Related Art

In thin film deposition and etch processes, such as physical vapor deposition ("PVD"), or "sputtering," a target material is bombarded by high energy gaseous ions. Material from the target is dislodged and sputters onto a work piece. The work piece may be, as examples, a semiconductor wafer, a magnetic disk, or a flat panel display.

For example, a PVD chamber, such as shown in FIGS. 1A and 1B (Prior Art) usually includes a chamber apparatus 14 generally constructed of stainless steel. A shield 19, generally constructed of aluminum, is mounted to the chamber directly or through use of an adapter 17 (also constructed of stainless steel) is sometimes, fitted appropriately to conform the chamber cavity. A clamping ring 16 is also sometimes employed in such apparatus.

The shield 19 is of an appropriate size and shape to protect the chamber cavity. For example, during the course of thin film processing, a work piece 36, such as a semiconductor wafer, is placed within the PVD chamber 14 through an opening 31 by automated machinery. A wafer table 25 is raised into a target location through the shield 19 to a position where PVD processing occurs. As a DC-biased target 30 on source 20 (electrically isolated by insulator 28) is bombarded by ions (such as argon) generated by a plasma created between the DC-biased target 30 and the work piece 36, target atoms are ejected within the chamber 14 and onto the work piece 36. The shield 19 prevents excess material sputtering from the target 30 from contaminating the remainder of the PVD chamber interior. Substantial heat is generated during this process, raising the temperature of the shield 19 and the chamber apparatus 14. The shield 19 is replaced once the build-up of excess target material reaches a point where flaking may impair further PVD processes.

Note that prior art type shields generally do not fully contact the chamber walls or adapter 17 during work piece processing. The shield 19 can be bolted to an adapter 17. FIG. 2 (Prior Art) shows the typical components of the shield 19 and adapter 17 subsystem and mounting bolts 21 that affix the shield 19 to the adapter 17. This procedure does not provide a good thermal coupling between the shield 19 and the adapter 17 or the chamber walls. During high power thin film processes (for example, aluminum or collimated titanium-nitride deposition), the shield may reach temperatures as high as 300 to 500 degrees Centigrade. The thermal expansion of the shield material can cause buckling or warping of the shield 19. In such buckled or warped regions, the shield 19 loses contact with the adapter 17 or the inner chamber walls, deteriorating even further the already poor thermal coupling. Excessive thermal expansion may contribute to the harmful contamination of the work piece 36.

Other shield mounting techniques, such as brazing or welding could provide good thermal contact, but are impractical within production PVD systems as they make removal and replacement difficult. Forced temperature maintenance, such as by water cooling the shield during high temperature processes, not only increases the complexity and cost of the system, but also risks the introduction of water vapor into the PVD chamber which is highly destructive to the PVD process itself.

There is a need, therefore, for an improved mounting of an anti-contamination shield for thin film process systems. As will be disclosed with respect to an alternative embodiment, the same principles apply to collimator plates used in collimated PVD processes. The same inventive principles can apply to any deposition and etch system where shielding is used to protect chamber walls from deposited or etched material and where significant heat has to be removed from the active inner portion of the chamber.

SUMMARY OF THE INVENTION

In accordance with the preferred embodiment of the present invention, a method and resulting apparatus for mounting a removable shield in a thin film process system, having a thin film process chamber, is presented. The method includes inserting a shield having at least one outer wall with external circumferential dimensions less than the circumferential dimensions of adjacent and complementary inner walls of the chamber, or, if used, an adapter for fitting a shield to a chamber apparatus. The temperature of the chamber is maintained such that the shield expands more than said chamber walls during operation of the thin film process. Thermal expansion of said shield compresses outer walls of the shield to inner walls of the chamber (or the adapter). The temperature difference between the chamber and the shield is maintained until it is desired or necessary to remove the shield. With appropriate predetermined design features, the press fit provides substantial thermal coupling between the shield and the chamber, or adapter, inner walls.

It is an advantage of the present invention that it provides good thermal contact between a thin film process system shield and the process chamber.

It is another advantage of the present invention that it reduces contamination of a thin film process chamber.

It is another advantage of the present invention that it eliminates the necessity for fastening mechanisms between the shield and adapter or process chamber body.

It is still another advantage of the present invention that the shield temperature and associated thermal expansion can be kept relatively low.

It is yet another advantage of the present invention that it can be applied to collimator plates and other thin film deposition and etch systems which employ anticontamination devices.

Other objects, features and advantages of the present invention will become apparent upon consideration of the following detailed description and the accompanying drawings, in which like reference designations represent like features throughout the FIGURES.

The drawings referred to in this description should be understood as not being drawn to scale except if specifically noted.

DETAILED DESCRIPTION OF THE INVENTION

Reference is made now in detail to a specific embodiment of the present invention, which illustrates the best mode presently contemplated by the inventor for practicing the invention. Alternative embodiments are also briefly described as applicable. The invention is disclosed in an exemplary embodiment for a PVD process chamber, but it will be recognized by those skilled in the art that the method and apparatus disclosed is readily adaptable to other apparatus in the field of thin film process technology.

Figure 1A:
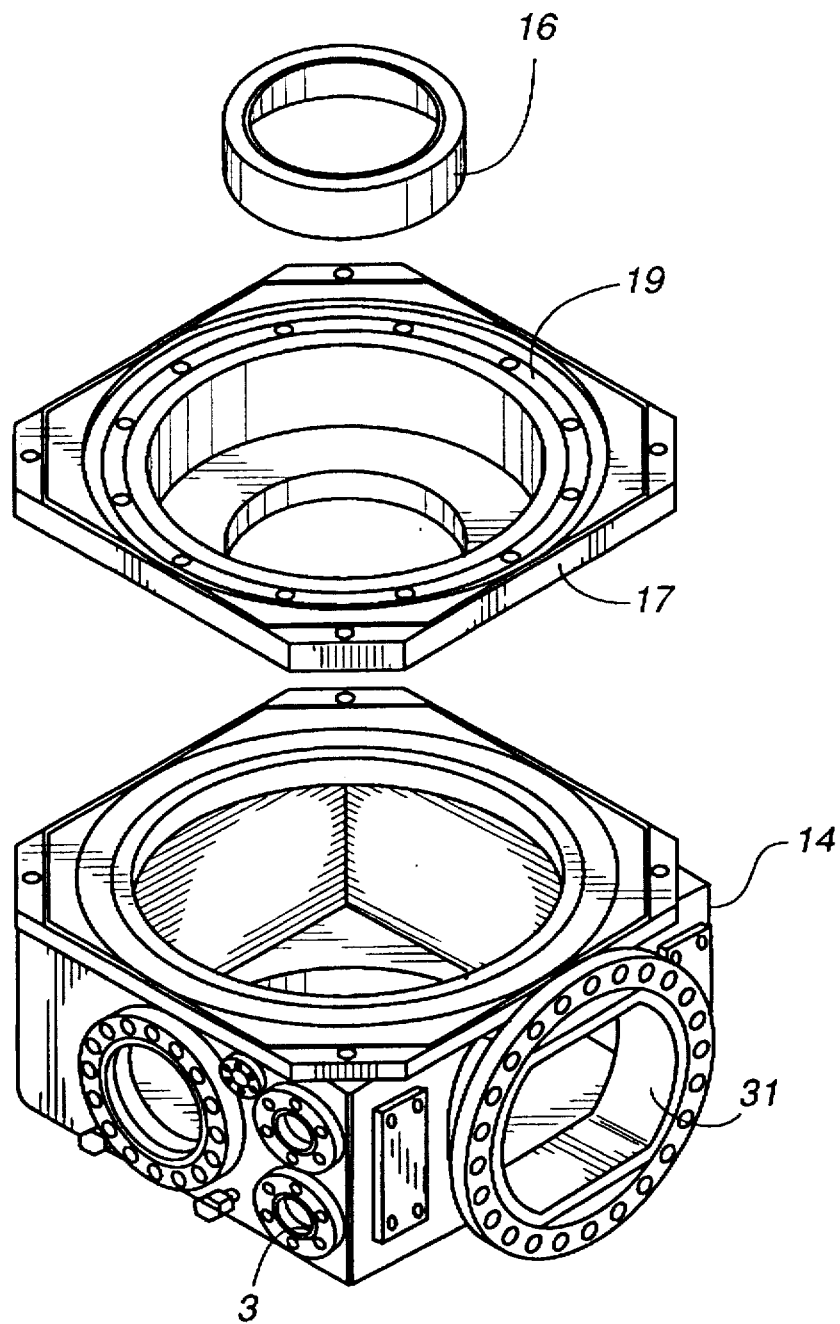
FIG. 1A (Prior Art) is an exploded, perspective view of a PVD chamber body, an adapter and shield subsystem, and a clamping ring.
Figure 1B:
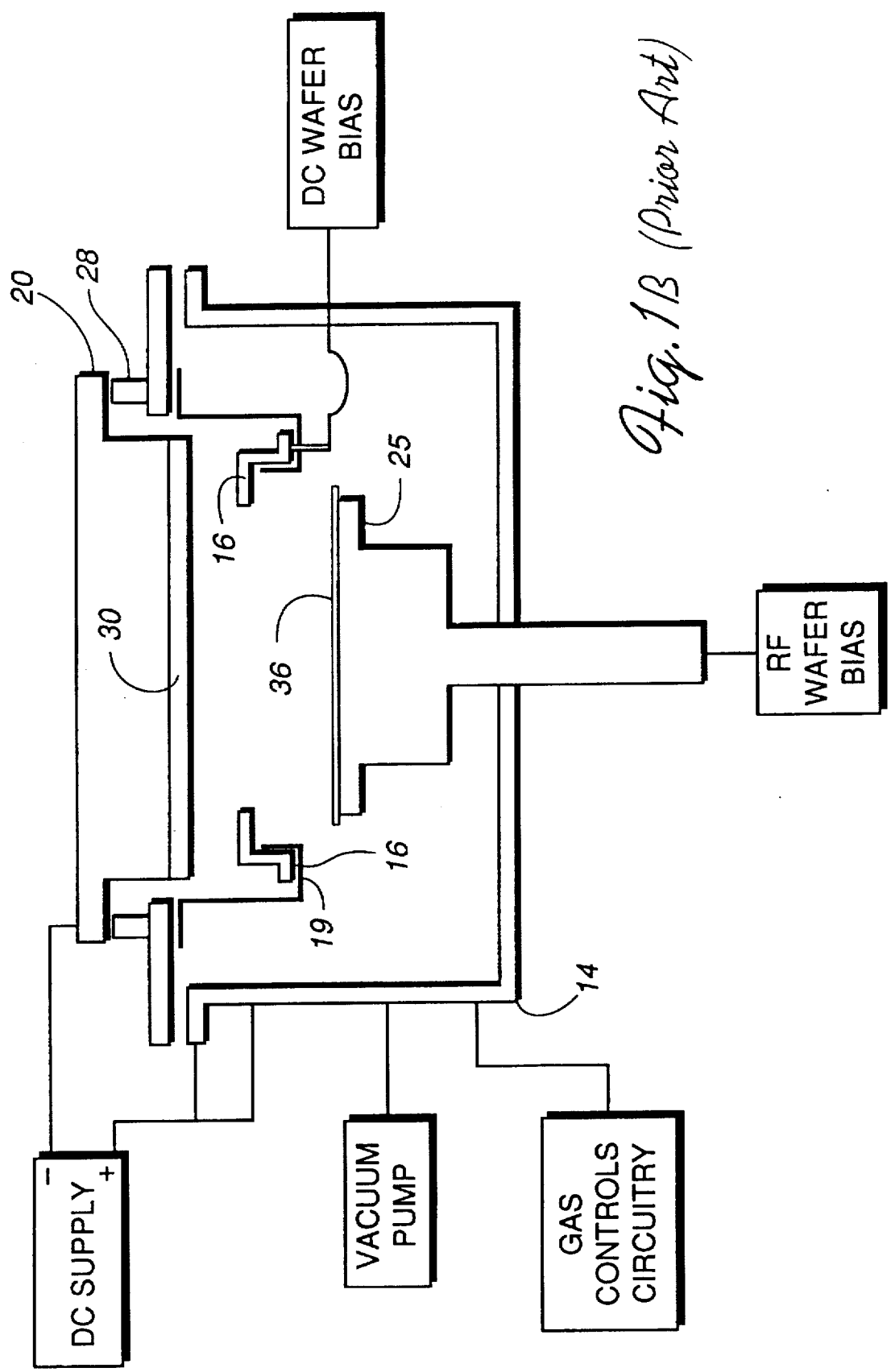
FIG. 1B (Prior Art) is a simplified, schematic, cross-sectional diagram of the PVD chamber of FIG. 1A, further depicting process devices in place.
Figure 2:
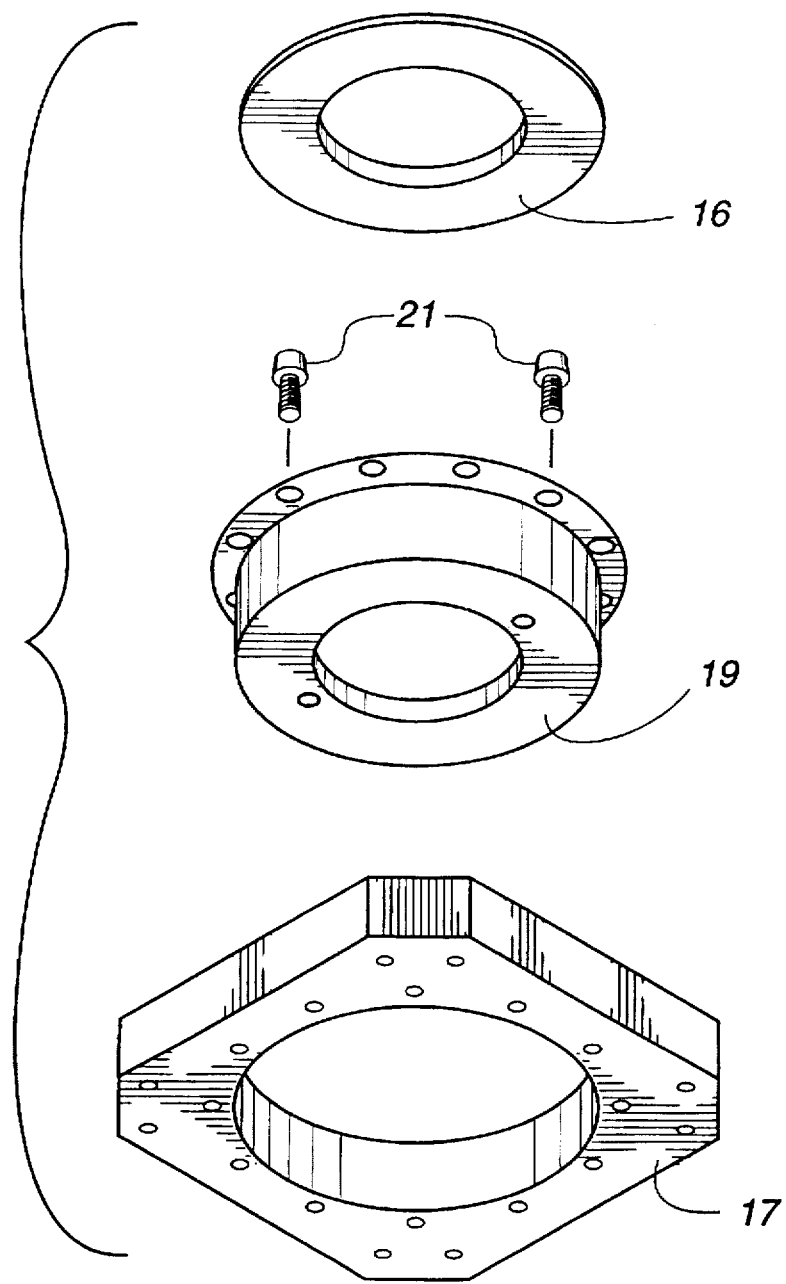
FIG. 2 (Prior Art) is an exploded, perspective view of an adapter and shield subsystem as shown in FIG. 1.
Figure 3:
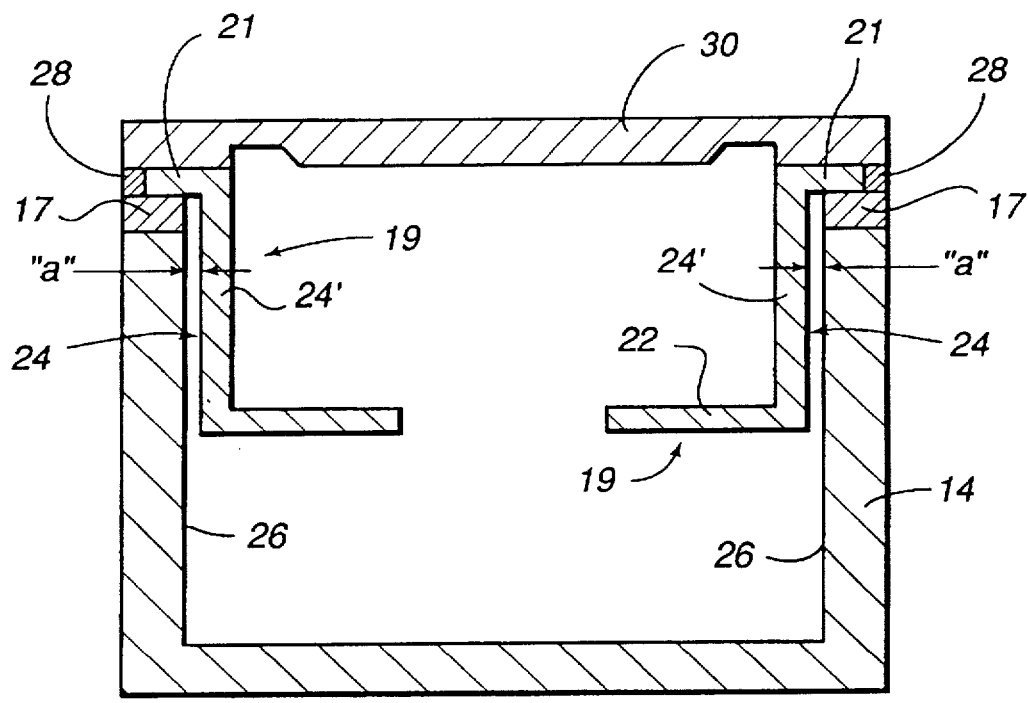
FIG. 3 is a simplified, schematic, cross-sectional diagram of a PVD system in accordance with the present invention.

Referring now to FIG. 3, a generally cylindrical shield 19, having a wall portion 24', is designed to slip fit coaxially into a PVD chamber body 14 when both are substantially at room temperature (or some similar predetermined ambient temperature) such that a small gap (designated "a") separates an outer wall 24 of shield portion 24' from a chamber inner wall 26. A shielding portion 22 of the shield extends radially inward into the chamber cavity. A similar gap separates the shield outer wall 24 from any adapter 17 longitudinally interposed between the chamber 14 and a support portion 21 of the shield 19. As is known in the art, an electrical insulator 28 is mounted to the adapter 17 and separates the PVD target 30 from the chamber body 14.

Figure 4:
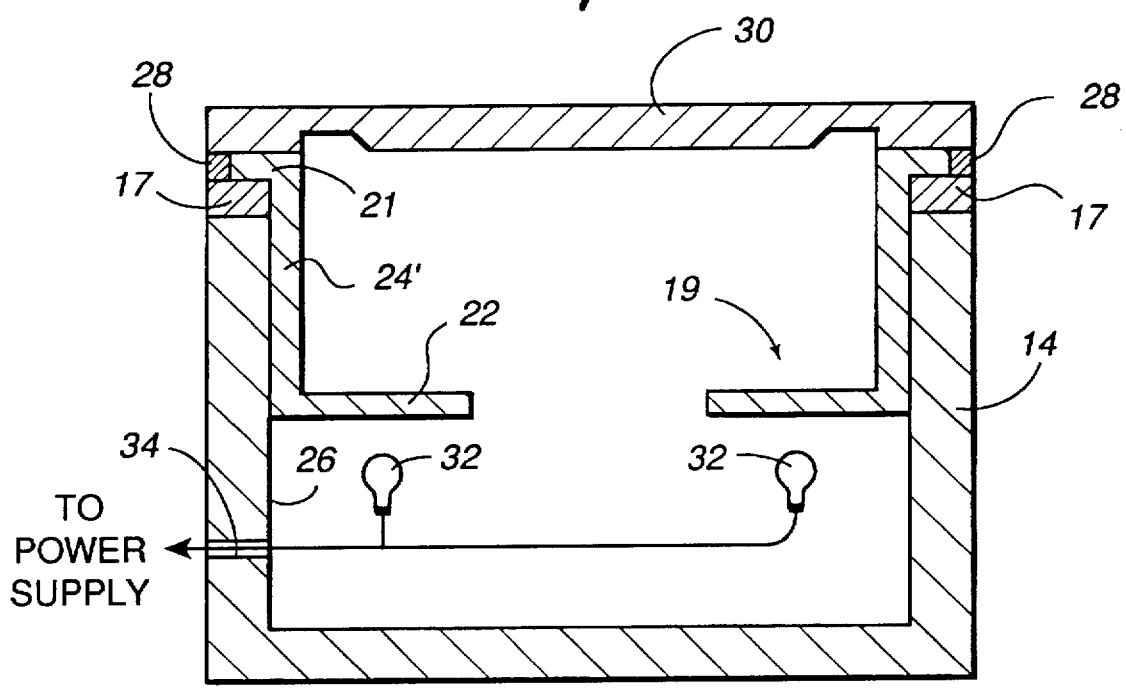
FIG. 4 is a simplified, schematic, cross-sectional diagram of a PVD system as shown in FIG. 3 after implementation of the method of the present invention.

When power is applied to the sputtering target 30, the resultant discharge will heat up the interior of the chamber apparatus 14. The chamber body 14, and adapter 17, if any, are maintained at a substantially constant temperature (for example, by known water cooling techniques applied to the outer walls of the PVD chamber, directly to the PVD chamber, or to the adapter). Thus, the chamber apparatus remains substantially at a predetermined ambient temperature. The shield 19 will expand. The materials chosen for the parts and the design tolerance of gap "a" between the shield outer wall 24 and the chamber inner wall 26 (or adapter 17, if used) is predetermined such that when the shield 19 reaches a predetermined temperature, for example 100 to 200 degrees Centigrade, the shield 19 will have expanded so that the gap "a" is closed and the shield outer wall 24 is firmly abutting the chamber inner wall 26 as shown in FIG. 4. The relatively large forces associated with thermal expansion will compress the shield 19 against the chamber inner wall 26, in a substantially sealing, thermally conductive, press fit. If an adapter 17 is employed, expansion to form a thermally coupled compression fit between the adapter 17 and the shield 19 may be sufficient so as to make contact with the chamber inner wall 26 an optional requirement.

Once the PVD process is initiated, the temperature will tend to continue to rise until a high point is reached. However, the chamber inner wall 26 (or adapter 17) being in compressive contact with the shield 19 forms a heat sink for the shield 19. In other words, the shield 19 temperature will be limited, or "clamped," to approximately the temperature at which the shield outer wall 24 is press fit to the chamber inner wall 14 (or adapter 17) and a steady state heat exchange is established. That is, the shield 19 will be substantially maintained at a temperature where thermal coupling is such that heat flux out of the shield 19 into the chamber body 14 (or adapter 17) is equal to the heat flux into the shield 19 during the PVD process.

In the preferred embodiment, the chamber inner walls 26 and the shield outer walls 24 are substantially cylindrical to ensure that the shield 19 is pressed uniformly to the chamber walls 26 and to avoid any buckling of the shield 19. While a cylindrical shape for the chamber walls and shield has been demonstrated, it will be obvious to a person skilled in the art that other shapes in which the outer portion of the shield is complementary to the inner features of the chamber, or the adapter, to which it is to be heat clamped may be similarly designed.

In an exemplary embodiment, a stainless steel chamber body 14 (and adapter 17), having a cylindrical inner wall 26, is maintained at approximately room temperature. The inner diameter of the chamber body 14 is 15-inches. A cylindrical shield 19 can be fabricated from aluminum material having a room temperature, outer diameter of 14.96-inches. Such tolerances can be easily met in the state of the art for manufacturing the parts of such a system. Having a thermal expansion coefficient of $25.10^{-6}$ $K^{-1}$, the shield 19 will expand to close the gap "a" and press fit against the inner wall 26 (and/or adapter 17) at a temperature of approximately 120 degrees Centigrade. In other words, if the chamber is maintained at room temperature, the shield 19 will be clamped to the inner wall 26 of the chamber body 14 at approximately 120 degrees Centigrade. It has been determined that a temperature differential range of fifty to three hundred degrees Centigrade is appropriate to maintain thermal coupling.

When the PVD process is finished, the DC-biasing is removed so that the heat load is eliminated while the work piece 36 is being extracted and the table 25 reloaded. It is desirable to maintain the press fit seal between the shield 19 and the chamber body 14 (or adapter 17) until such time as the shield 19 is to be removed for cleaning or disposal. As shown in FIG. 4, lamps, such as halogen or tungsten bulbs (as are known to be used in pre-PVD processes to bake out water vapor from the chamber), may be employed to maintain the predetermined temperature at which the steady state heat flow was established, preventing contraction of the shield 19 after the processing cycle is finished.

Figure 5:
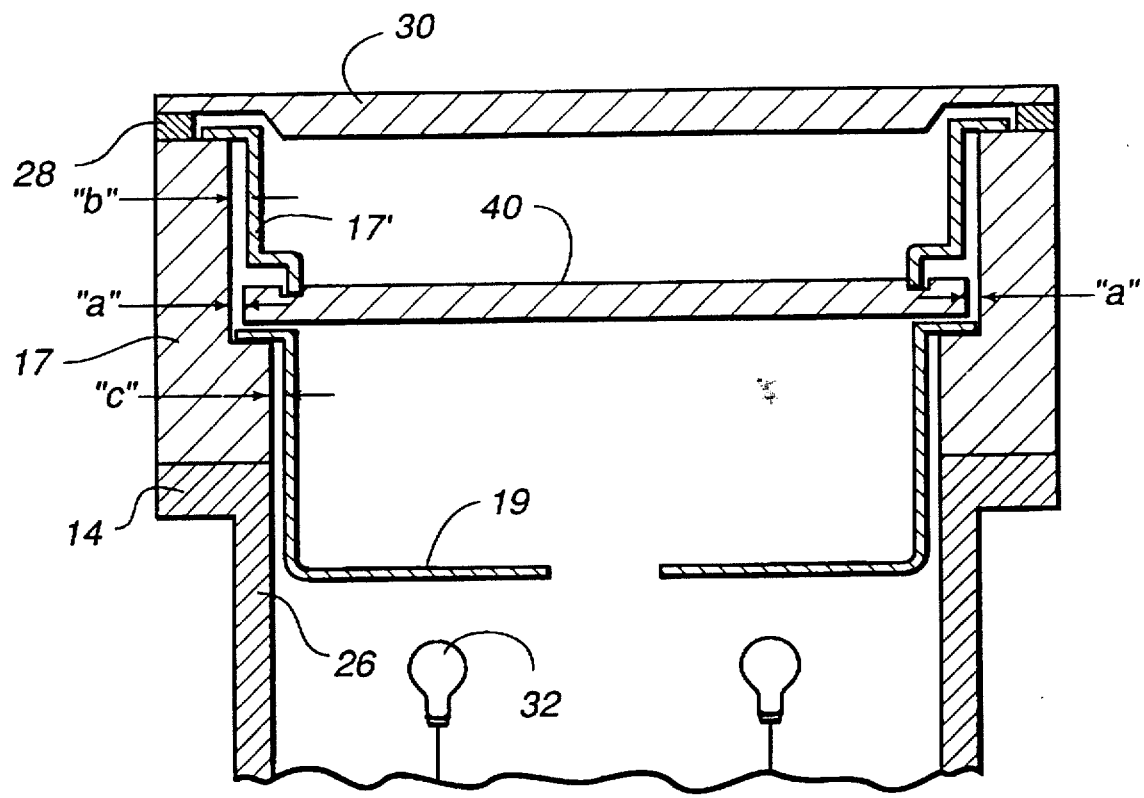
FIG. 5 is a simplified, schematic, partial cross-sectional diagram of an alternative embodiment of a PVD system implemented in accordance with the present invention.

Referring now to FIG. 5, an alternative embodiment of the invention is shown. This embodiment will be recognized by those skilled in the art as disclosing a construction of special relevance for collimated sputtering. A collimator plate 40 can be machined with such tolerances that it fits with a gap "a" into the PVD chamber at room temperature. Similar to the earlier described embodiments where the shield temperature is clamped during processing, the collimator 40 temperature will be clamped to that where the outer diameter of the collimator equals the inner diameter of the PVD chamber. Note that clamping one of the gaps "a" or "b" or "c" achieves the goal of the present invention.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Similarly, any thin film process steps described might be interchangeable with other steps in order to achieve the same result. The embodiment was chosen and described in order to best explain the principles of the invention and its practical application to thereby enable others skilled in the art to understand the invention for various embodiments and with various modifications as are suited to the particular use contemplated. It is intended that the scope of the invention be defined by the claims appended hereto and their equivalents.

What is claimed is:

1. A vacuum processing chamber for depositing a thin film on a substrate, said chamber having an inner sidewall;

an adaptor fitted to the top of the chamber wall;

a removable shield having a size and shape complementary to and smaller than said chamber inner sidewall so as to form a gap therebetween at a first temperature and having an extension overlying said wall and adjacent to said adaptor;

a heater for maintaining the temperature of said shield at a second temperature higher than said first temperature and sufficient to cause the shield to expand against said inner sidewall.

2. A vacuum processing chamber according to claim 1 wherein a constant temperature difference is maintained between said shield and said inner sidewall between deposition steps so as to maintain contact therebetween.

3. A vacuum processing chamber according to claim 2 wherein the temperature difference between said shield and said inner sidewall is between about 50° to about 300° C.

4. A vacuum processing chamber according to claim 1 wherein said temperature is sufficient to press fit the shield against the adaptor and said sidewall.

5. A vacuum processing chamber according to claim 1 further including a collimator having a diameter smaller than the inner sidewall of said chamber and having a thermal coefficient of expansion such that at said second temperature the collimator expands to press fit against the inner sidewall of said chamber.

6. A vacuum processing chamber according to claim 5 wherein a constant temperature difference is maintained between said collimator and said inner sidewall between deposition steps so as to maintain contact therebetween.

7. A vacuum processing chamber according to claim 6 wherein the temperature difference between said collimator and said inner sidewall is between about 50° to about 300° C.

* * * * *